United States Patent [19]

Held

[11] 4,147,549
[45] Apr. 3, 1979

[54] LITHOGRAPHIC PRINTING PLATE HAVING ADDITION POLYMERIZED AREAS AND BINDER AREAS

[75] Inventor: Robert P. Held, Englishtown, N.J.

[73] Assignee: E. I. Du Pont de Nemours and Company, Wilmington, Del.

[21] Appl. No.: 808,906

[22] Filed: Jun. 22, 1977

Related U.S. Application Data

[63] Continuation-in-part of Ser. No. 614,229, Sep. 17, 1975, abandoned, which is a continuation-in-part of Ser. No. 435,411, Jan. 22, 1974, abandoned.

[51] Int. Cl.² .......................... G03C 1/94; G03C 5/00
[52] U.S. Cl. ............................................. 96/85; 96/33; 96/35.1; 96/86 P; 96/87 R; 96/115 P; 101/456; 101/457; 101/462
[58] Field of Search ....................... 96/35.1, 33, 115 P, 96/85, 87 R, 86 P; 101/456, 457, 462

[56] References Cited

U.S. PATENT DOCUMENTS

| | | | |
|---|---|---|---|
| 3,475,171 | 10/1969 | Alles | 96/35.1 |
| 3,751,259 | 8/1973 | Bauer et al. | 96/35.1 |
| 3,784,378 | 1/1974 | Gramas | 96/33 |

FOREIGN PATENT DOCUMENTS

1294896  11/1972  United Kingdom ......................... 96/33

*Primary Examiner*—Jack P. Brammer

[57] ABSTRACT

A lithographic printing plate is prepared from a layer of a photopolymerizable composition comprising an oleophilic macromolecular organic binder and a leachable hydrophilic ethylenically unsaturated compound by exposing the layer and then leaching the compound from the unexposed areas by treating with a suitable developing solvent, preferably water, producing an oleophilic surface. A similar plate may be prepared from a composition containing a hydrophilic binder and oleophilic leachable compound by imagewise exposure and solvent leaching producing an oleophilic surface in exposed areas and a hydrophilic surface in unexposed areas.

7 Claims, No Drawings

LITHOGRAPHIC PRINTING PLATE HAVING ADDITION POLYMERIZED AREAS AND BINDER AREAS

CROSS REFERENCE TO RELATED APPLICATIONS

This application is a continuation-in-part of U.S. application Ser. No. 614,229, filed Sept. 17, 1975, now abandoned which is a continuation-in-part of U.S. application Ser. No. 435,411, filed Jan. 22, 1974, now abandoned.

BACKGROUND OF THE INVENTION

This invention relates to lithographic printing plates and more particularly to planographic printing plates prepared from negative-working or positive-working photopolymerizable elements. Still more particularly, it relates to improved processes for preparing photopolymer lithographic printing plates using more convenient solvent developers and permitting latitude in the choice of supports.

Negative working lithographic printing plates having a photopolymerizable light-sensitive layer are well known in the art. Such plates generally comprise a hydrophilic support covered with a layer of a photopolymerizable hydrophobic composition. After imagewise exposure to actinic radiation which hardens the photopolymerizable layer imagewise, the unhardened portions of the layer are removed by washing with a suitable solvent, leaving an oleophilic polymer image on a hydrophilic support, suitable for use as a lithographic printing plate. Such plates are described, for example, in Alles U.S. Pat. No. 3,458,311, and Bauer et al. U.S. Pat. No. 3,751,259.

In British Pat. No. 1,294,896, there is described a method of making printing plates by leaching a photocurable composition from the unexposed areas of a porous support. A critical support porosity is required, and the hydrophilicity or oleophilicity of the support must be the opposite of that of the photocurable composition to provide an image composed of hydrophilic and oleophilic areas. This method and the other prior art require removal of the photosensitive material in the unexposed areas, whereas in the present invention, the original layer remains throughout the entire surface of the support and is subjected to leaching to produce hydrophilic and oleophilic areas in the layer.

Bauer et al. U.S. Pat. No. 3,751,259 discloses photopolymerizable compositions that are useful in the manufacture of presensitized printing plates for relief as well as planographic printing. There is no teaching that the binder component remains over the entire surface of the support and that in the unpolymerized image areas only the ethylenically unsaturated monomer has been substantially removed. This is substantiated by the fact that Bauer et al. require an additional step between development and application of suitable ink for printing.

SUMMARY OF THE INVENTION

In accordance with this invention there are provided printing plates having addition polymerized and unpolymerized image areas which comprise a support bearing over its entire surface a layer comprised of a hydrophilic or oleophilic polymer and in the addition polymerized image areas a polymerized ethylenically unsaturated monomer of hydrophilic or oleophilic character opposite that of the polymeric binder, the unpolymerized image areas being substantially free of said ethylenically unsaturated monomer. The printing plate is formed by imagewise exposing the element to actinic radiation and leaching out the ethylenically unsaturated compound in the unexposed areas, leaving only the binder in these areas and the photohardened original composition in the exposed areas.

DESCRIPTION OF THE PREFERRED EMBODIMENTS

While the printing plate and process of making same are described in the singular with respect to the binder and monomer, this description shall also import the plural, since combinations of binders and monomers can be used. The term "leaching" imports removal of the monomer by any means, usually with a solvent developer. The photosensitive layer may also contain an addition polymerization initiator and other adjuvants such as fillers, dyes, and plasticizers, and it may be laminated with a strippable protective cover layer. When a protective layer is used either the layer or the support must of necessity be transparent to actinic radiation used to image the layer and the cover layer would be removed at least before leaching.

As used in the description of this invention and the appended claims, the term "solvent developer" means a solvent or solvent mixture which can leach residual unpolymerized monomer from binder and polymerized monomer; that is, a solvent or solvent mixture which can permeate the photosensitive layer and dissolve or remove the unpolymerized monomer without substantially dissolving either binder or polymerized monomer. Similarly, the leachable monomer is an addition polymerizable ethylenically unsaturated compound and is soluble in the solvent developer in which the binder and polymerized monomer are significantly less soluble. An oleophilic surface is a surface which accepts greasy ink and a hydrophilic surface is a surface which accepts water and therefore rejects greasy ink. A positive-working lithographic plate is one having a positive oleophilic image in which the oleophilic areas correspond to the black areas of the transparency through which exposure is made, and the areas corresponding to the clear areas of the transparency are hydrophilic and oleophobic. A lithographic plate having a negative oleophilic image is defined as a "negative-working" plate. A "negative" copy is defined as a copy obtained from a negative-working plate. Positive-working and negative-working plates are prepared from positive-working and negative-working photosensitive elements respectively.

In a preferred embodiment of this invention, truly planographic printing plates with oleophilic and hydrophilic surfaces in substantially the same plane are prepared from positive-working photosensitive elements. These elements comprise a support, a photosensitive layer or stratum and may have a strippable protective cover layer. The photosensitive layer contains an oleophilic polymer binder which is substantially insoluble in the solvent developer, a solvent soluble, ethylenically unsaturated monomer capable of undergoing photoinitiated addition polymerization to a hydrophilic polymer which is substantially insoluble in the solvent developer, and an effective amount of a polymerization initiator activatable by actinic radiation and inactive thermally below 85° C. To prepare a positive-working planographic printing plate useful in offset lithography the element is exposed to actinic radiation through a process positive transparency, the protective cover layer is stripped away and the surface of the exposed stratum is washed with a solvent developer which leaches monomer from the unexposed areas of the stratum. The resulting stratum contains a positive, oleophilic ink receptive surface from which the monomer has been leached and a complimentary negative, hydrophilic surface comprised of the hydrophilic polymer formed.

In an equally preferred aspect of this invention a negative-working planographic printing plate is prepared from a negative-working photosensitive element. This element is the same as the positive-working element except that the binder is a hydrophilic polymer binder which is substantially insoluble in the solvent developer and the solvent soluble monomer is a monomer capable of undergoing photoinitiated polymerization to an oleophilic polymer which is substantially insoluble in the solvent developer. To prepare a planographic printing plate the element is exposed to actinic radiation through a process negative transparency, the protective cover layer is removed and the surface of the exposed stratum is washed with a solvent developer. The resulting stratum contains a positive, oleophilic, ink receptive surface comprised of the oleophilic polymer formed and a complementary negative hydrophilic surface from which the monomer has been leached.

Solvent developers particularly useful in preparing planographic printing plates include water; ethanol; 2-methoxyethanol; and solvent mixtures like water/ethanol, water/acetone and water/polyoxyethylene oleyl ether. Of these, water is particularly preferred. As is apparent to one with ordinary skill in the art the leaching effect during development can be optimized by adjusting the temperature of the solvent developer. Also useful as solvent developers are printing press fountain solutions, greasy inks and ink-water dispersions and in a further embodiment such solvent developers can be used on press to develop an exposed plate thus incorporating the developing step with the press run.

Conventional milling, mixing of and solution techniques can be used in making the compositions, the particular technique varying with the differences in properties of the respective components. The elements useful in this invention are conveniently prepared by dissolving the components of the photosensitive layer in a volatile solvent such as acetone, trichloroethylene, or a low molecular weight alcohol; coating the solution on a support, such as a plastic film or a paper or brushed aluminum sheet, by skim coating, doctor blade coating or other conventional coating technique; and allowing the solvent to evaporate. A protective cover layer may then be applied to the surface of the photosensitive layer. Besides solvent casting the photosensitive layer may be prepared by any other conventional technique, for example, hot melt coating, hot pressing, calendering or extrusion onto the support. The binder is present in an amount from 10 to 90 percent by weight, and the monomer may comprise 90 to 10 percent by weight of the composition.

Preferred binders useful in preparing a positive-working, lithographic printing plate of this invention are film forming polymers or macromolecular colloids which have molecular weights above 10,000, are oleophilic, and are substantially insoluble in solvent developers used, e.g. hot water. Such suitable binders include poly(caprolactone); polyacrylate and alpha-alkyl polyacrylate esters, e.g., polymethacrylate, polymethyl methacrylate and polyethyl methacrylate; vinylidene chloride copolymers, e.g., vinylidene chloride/acrylonitrile, vinylidene chloride/methacrylate and vinylidene chloride/vinylacetate copolymers, ethylene/vinyl acetate copolymers; polyethylene; polyvinyl esters, e.g., polyvinyl acetate/acrylate, polyvinyl acetate/methacrylate and polyvinyl acetate; copolyesters, e.g., those prepared from the reaction product of a polymethylene glycol of the formula $HO(CH_2)_nOH$, wherein n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic, sebacic and adipic acids; nylons or polyamides, e.g., N-methoxymethyl polyhexamethylene adipamide; synthetic rubbers, e.g., butadiene/acrylonitrile copolymers, and chloro-2-butadiene-1,3-polymers; block copolymers, e.g., polystyrene-polybutadiene-polystyrene and polystyrene-polyisoprene; polyvinyl chloride and copolymers, e.g., polyvinyl chloride/acetate; polyvinyl acetal, e.g., polyvinyl butyral, polyvinyl formal; polyurethanes; polycarbonates; polystyrene; phenolic resins; and melamine-formaldehyde resins.

Preferred binders useful in preparing negative-working lithographic printing plates of this invention are film forming polymers or macromolecular colloids which have molecular weights above 10,000, are hydrophilic and are substantially insoluble in solvent developers used, e.g., water. Such suitable binders include polyvinyl alcohol; cellulose; cellulose ester, e.g., cellulose acetate succinate and cellulose acetate butyrate; cellulosic ethers, e.g., methyl cellulose, ethyl cellulose and benzyl cellulose; and polyethylene oxides having average molecular weights to about 1,000,000 and ethers of such polyethylene oxides.

Suitable leachable monomers useful in preparing positive-working lithographic plates of this invention are free-radical initiated, chain propagating, addition polymerizable ethylenically unsaturated compounds which are substantially soluble in a solvent developer and which upon photoinitiated polymerization form hydrophilic polymers which are substantially insoluble in the solvent developer. Particularly preferred monomers of this type are those containing one or more of the group $-(CH_2-CH_2-O)_{-x}$ where x is 2 or more. Such monomers are: triethylene glycol dimethacrylate, triethylene glycol diacrylate, tetraethylene glycol dimethacrylate, tetraethylene glycol diacrylate; and trimethylol-propane ethylene oxide adduct triacrylates and trimethacrylates and other ethylene oxide adduct monomers described in Cohen et al. U.S. Pat. No. 3,380,831.

Suitable leachable monomers useful in preparing negative-working lithographic plates of this invention are free-radical initiated, chain propagating, addition polymerizable ethylenically unsaturated compounds which are substantially soluble in a solvent developer and which upon photoinitiated polymerization form oleophilic polymers.

The following specific compounds are illustrative of this class; unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polypropylene glycols of molecular weight 200–500, and the like; unsaturated amides, particularly those of the alpha-methylene carboxylic acids, and especially those of alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(gamma-methacrylamidopropoxy) ethane, beta-methacrylamidoethyl methacrylate, N-(beta-hydroxyethyl)-beta-(methacrylamido)ethyl acrylate and N,N-bis(beta-methacryloxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon. The preferred monomeric compounds are difunctional, but monofunctional monomers can be used. Acrylic and methacrylic esters of polyhydroxy compounds such as pentaerythritol and trimethylol propane are also useful.

A preferred class of free-radical generating, addition polymerization initiators activatable by actinic light and thermally inactive at and below 85° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloro-anthraquinone, 2-chloro-anthraquinone, 2-methyl-anthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in Plambeck, U.S. Pat. No. 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin, and α-phenylbenzoin.

Particularly preferred photoinitiators are the 2,4,5-triphenylimidazolyl dimers disclosed in Chambers, U.S. Pat. No. 3,479,185, Nov. 18, 1969. Also useful are the photoinitiating combinations disclosed in British Pat. No. 1,090,142, as well as the combinations of Michler's ketone with 2,4,5-triphenylimidazolyl dimers disclosed in Chang and Fan U.S. Pat. No. 3,549,367, issued Dec. 22, 1970. Other useful initiators and initiator systems are disclosed in Fan, U.S. Pat. No. 3,558,322, issued Jan. 26, 1971 and in assignee's application Chang, U.S. Ser. No. 877,853, filed Nov. 18, 1969, now U.S. Pat. No. 3,661,588, issued May 9, 1972.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, napthylamines, beta-naphthol, cuprous chloride. 2,6-di-tert-butyl p-cresol, phenothiazine, pyridine, nitrobenzene and dinitrobenzene. Other useful inhibitors include p-toluqinone and chloranil.

Suitable base or support materials include metals, e.g., steel and aluminum plates, sheets and foils, paper sheets, and films or plates composed of various film-forming synthetic resins or high polymers, such as the addition polymers and, in particular, vinylidene chloride copolymers with vinyl chloride, vinyl acetate, styrene isobutylene and acrylonitrile; vinyl chloride homopolymers and copolymers with vinyl acetate, styrene isobutylene and acrylonitrile; linear condensation polymers such as polyesters, e.g., polyethylene terephthalate, polyamide, e.g., polyhexamethylenesebacamide; polyimides, e.g., films as disclosed in assignee's Edwards, U.S. Pat. No. 3,179,634 and polyester amide, e.g., polyhexamethylene-adipamide adipate. Fillers or reinforcing agents can be present in the synthetic resin or polymer bases such as the various fibers (synthetic, modified, or natural), e.g., cellulosic fibers, for instance, cotton, cellulose acetate, viscose rayon, paper, glass, wool; nylon and polyethylene terephthalate. These reinforced bases may be used in laminated form. Various anchor layers disclosed in U.S. Pat. No. 2,760,863 can be used to give strong adherence between the support and the photosensitive layer or, in the case of transparent support, pre-exposure through the support to actinic radiation can be used. The adhesive compositions disclosed in assignee's Burg U.S. Pat. No. 3,036,913 are also effective.

Preferably, the elements useful in this invention have a protective cover layer to prevent contamination of, or damage to the photosensitive layer during storage, manipulation, or exposure. When necessary the protective cover layer may also act as an oxygen barrier improving exposure characteristics to actinic radiation. In general, the protective cover layer is transparent to actinic radiation, particularly when the support is an opaque material. The protective cover layer may be a thin plastic film or sheet laminated to the surface of the photosensitive layer, e.g., polystyrene, polyethylene, polypropylene, polyethylene terephthalate,etc. After imagewise exposure the cover sheet is stripped off or delaminated and the photosensitive layer is developed. Alternatively the protective cover layer may be a coating of a macromolecular colloid or polymer applied to the surface of the photosensitive layer, e.g. polyvinyl alcohol, polyvinyl alcohol/polyvinyl pyrrolidone, gelatin, etc. Such overcoat layers are stripped by solvents after imagewise exposure, preferably by the solvent used as the solvent developer, e.g., hot water. The solvent of course should not remove the binder or photopolymer of the imaged photosensitive layer.

Since free-radical generating, addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs are customarily used at a distance of one and one-half to 20 inches from the photopolymerizable layer. It is noted, however, that in certain circumstances it may be advantageous to expose with visible light, using a photoinitiator sensitive in the visible region of the spectrum, e.g., 9,10-phenanthrenequinone or a combination of a sensitizing dye such as methylene blue with an initiator. In such cases, the radiation source should furnish an effective amount of visible radiation. Many of the radiation sources listed above furnish the required amount of visible light.

After an imaged photosensitive element has been developed it can be given an overall post exposure to actinic radiation to polymerize any residual monomer within the layer thereby preventing migration to the monomer free surface during subsequent storage and use.

The invention will now be further illustrated by the following examples:

EXAMPLE I

A coating solution was prepared having the following composition.

| | |
|---|---|
| Poly(methylmethacrylate) (M.W. 30,000) | 50 g |
| Polyoxyethyltrimethylolpropane triacrylate (ave. mol. wt. 1,000) | 60 g |
| 2-0-chlorophenyl-4,5-bis(m-methoxyphenyl) imidazolyl dimer | 0.5 g |
| 2-mercaptobenzothiazole | 2.0 g |
| 2-(Stilbyl-4")-(naphtho-1',2';4,5)-1,2,3-triazole-2"-sulfonic acid phenyl ester | 0.2 g |
| Polyoxyethylene lauryl ether (M.W. 362) | 10 g |
| 2,2'-dihydroxy-4-methoxybenzophenone | 0.2 g |
| Trichloroethylene to make | 600 g |

The coating solution was coated with a doctor knife to a wet thickness of 0.020 inch on a subbed 0.004 inch thick polyethylene terephthalate support made according to Example IV of Alles, U.S. Pat. No. 2,779,684, and allowed to dry. The dried coating was laminated with a 0.001 inch thick polyethylene terephthalate cover sheet. A sample of the element was exposed through a process transparency with a xenon arc source (nuArc ® Platemaker, Model FT26L of the flip top type, manufactured by nuArc Co., Inc.) for 13 seconds. The cover sheet was stripped and the element was washed for 15 seconds with warm water (about 90° F.). The sample was placed on offset type office copy machine, inked with lithographic printing ink, and used to print at least 100 offset positive copies of the transparency on bond paper.

EXAMPLE II

A coating solution was prepared having the following composition.

| | |
|---|---|
| Vinyl chloride/vinyl acetate/vinylidene chloride terpolymer | 10 g |
| Polyoxyethyltrimethylolpropane triacrylate (ave. Mol. Wt. 1,000) | 10 g |
| Triethylene glycol diacetate | 2 g |
| 2-Ethylanthraquinone | 0.3 g |
| Methylene chloride to make | 80 g |

The solution was coated with a doctor knife to a wet thickness of 0.006 inches on the polyethylene terephthalate support of Example I, dried, and laminated with a 0.001 inch thick polypropylene cover sheet. A sample of the element so prepared was exposed through a process transparency as in Example I for 45 seconds. The cover sheet was removed and the elemengt was washed with water (90° F.) for about 15 seconds. The developed sample was rubbed with a swab coated with black lithographic ink. The ink adhered imagewise to the unexposed portions of the surface of the element.

EXAMPLE III

A coating solution was prepared having the following composition:

| | |
|---|---|
| Poly(methyl methacrylate) (M.W. 30,000) | 10 g |
| Tetraethylene glycol dimethacrylate | 10 g |
| Triethylene glycol diacetate | 4 g |
| 2-0-chlorophenyl-4,5-bis(m-methoxyphenyl) imidazolyl dimer | 0.4 g |
| 2-Mercaptobenzothiazole | 0.04 g |
| 2-(Stilbyl-4")-napho-1',2';4,5)-1,2,3-triazole-2"-sulfonic acid phenyl ester | 0.05 g |
| Methylene chloride to make | 80 g |

An element was prepared from this solution as in Example II. The element was exposed as in Example I for 55 seconds. The cover sheet was removed and the element developed by washing with 50/50 volume percent ethanol/water solution. The sample, when inked as in Example II, accepted ink in the unexposed areas.

EXAMPLE IV

A coating solution was prepared having the following composition.

| | |
|---|---|
| Poly(caprolactone) (average M.W. 40,000) | 10 g |
| Polyoxyethyltrimethylolpropane triacrylate (ave. mol. wt. 1,000) | 10 g |
| Polyoxyethylene oleyl ether (M.W. 356) | 2 g |
| 2-0-chloro-4,5-bis(m-methoxyphenyl) imidazolyl dimer | 0.4 g |
| 2-mercaptobenzothiazole | 0.05 g |
| 2-(Stilbyl-4")-naptho-1',2':4,5)-1,2,3-triazol-2"-sulfonic acid phenyl ester | 0.05 g |
| Methyl ethyl ketone/methylene chloride (90/10 parts by volume) to make | 150 g |

An element was prepared from this solution as in Example II. The element was exposed as in Example I for 45 seconds. The cover sheet was removed and the element developed by washing for 15 seconds with warm water (90° F.) followed by wiping with polyoxyethylene (2) oleyl ether. When inked as in Example II the sample accepted ink in the unexposed areas.

EXAMPLE V

A coating solution was prepared having the following composition.

| | |
|---|---|
| Poly(methyl methacrylate) (M.W. 30,000) | 10 g |
| Triethylene glycol dimethacrylate | 12 g |
| Triethylene glycol diacetate | 2 g |
| 2-0-chlorophenyl-4,5-bis(m-methoxyphenyl)imidazolyl dimer | 0.4 g |
| 2-mercaptobenzothiazole | 0.04 g |
| 2-(Stilbyl-4")-(naptho-1',2':4,5)-1,2,3-triazole-2"-sulfonic acid phenyl ester | 0.05 g |
| Methylene chloride to make | 80 g |

An element was prepared from this solution as in Example II. A sample of the element was exposed as in Example I for 45 seconds. The cover sheet was removed and the sample was developed by washing with ethanol. When inked as in Example II, the sample accepted ink in the unexposed areas.

EXAMPLE VI

Example V was repeated using 2-methoxy-ethanol as the developing solvent. When inked as in Example II, the sample accepted ink in the unexposed areas.

EXAMPLE VII

A coating solution was prepared having the following composition:

| | |
|---|---|
| Cellulose acetate-butyrate (17% butyrate) | 10 g |
| Trimethylol propane trimethacrylate | 10 g |
| 2-0-chlorophenyl-4,5-bis(m-methoxy phenyl) imidazolyl dimer | 0.4 g |
| 2-mercaptobenzothiazole | 0.05 g |
| 2-(Stilbyl-4")-(naptho-1',2':4,5)-1,2,3-triazole-2"-sulfonic acid phenyl ester | 0.05 g |
| Methyl ethyl ketone to make | 200 g |

The coating solution was coated with a doctor knife to a wet thickness of 0.006 inch on a subbed 0.004 inch thick polyethylene terephthalate support made according to Example IV of Alles U.S. Pat. No. 2,779,684, and allowed to dry. The dried coating was laminated at 100° C. with a 0.001 inch thick polypropylene cover sheet. A sample of the element was exposed through a process transparency with the nuArc ® light source of Example I for 45 seconds. The cover sheet was stripped and the element was washed with a 20:80 mixture by weight of acetone and water. The developed sample was rubbed with a swab coated with black lithographic ink. The ink adhered imagewise to the exposed portions of the surface of the element.

EXAMPLE VIII

A coating solution was prepared having the following composition:

| | |
|---|---|
| Hydroxy propyl cellulose | 15 g |
| Trimethylol propane triacrylate | 5 g |
| 2-0-chlorophenyl-4,5-bis(m-methoxy-phenyl) imidazolyl dimer | 0.4 g |
| 2-Mercaptobenzothiazole | 0.05 g |
| 2-(Stilbyl-4")-naptho-1',2':4,5)-1,2,3-triazole-2"-sulfonic acid phenyl ester | 0.05 g |
| Methyl cellosolve | 129.5 g |
| Acetone | 13 g |

An element was prepared from this solution and imagewise exposed as in Example VII. The cover sheet was removed and the surface of the sample was rubbed with a swab coated with a water-ink dispersion, Pitman Super Black D ink. The dispersion developed the plate and ink adhered imagewise to the exposed portions of the surface of the element.

EXAMPLE IX

A coating solution was prepared having the following composition:

| | |
|---|---|
| Poly(methylmethacrylate) (M.W. 30,000) | 50 g |
| Polyoxyethyltrimethylolpropane triacrylate (ave. Mol. Wt. 1,000) | 60 g |
| 2-0-chlorophenyl-4,5-bis(m-methoxy-phenyl) imidazolyl dimer | 0.5 g |
| 2-mercaptobenzothiazole | 2.0 g |
| 7-(4'-chloro-6'-diethylamino-1',3',5'-triazine-4'-yl)amino-3-phenylcoumarin | 0.2 g |
| Polyoxyethylene lauryl ether (M.W. 362) | 10 g |
| 2,2'-dihydroxy-4-methoxybenzophenone | 0.2 g |
| Trichloroethylene to make | 600 g |

The coating solution was coated with a doctor knife to a wet thickness of 0.020 inch on a grained aluminum plate and dried. The plate was then overcoated with the following composition.

| | |
|---|---|
| Polyvinyl pyrrolidone (M.W. 30,000) | 90 g |
| Polyvinyl alcohol (medium viscosity 88% saponified) | 60 g |
| 2-ethoxyethanol | 45 ml |
| Ethanol | 45 ml |
| Isooctyl phenyl polyethoxy (10) ethanol (10% aqueous solution) | 15 ml |

The dried sample of the element was exposed through a process transparency with the nuArc ® Platemaker for 15 seconds. The exposed plate was washed with warm water (about 100° F.) until the overcoat layer was removed and the imaged sample developed. The developed sample was rubbed with a swab coated with black lithographic ink. The ink adhered imagewise to the unexposed portions of the surface of the element.

EXAMPLE X

A coating solution was prepared having the following composition:

| | |
|---|---|
| Cellulose acetate | 50 g |
| Polypropylene glycol ether of pentaerythritol tetraacrylate (mol. wt. 730) | 70 g |
| Benzoin methyl ether | 10 g |
| 2-hydroxy-4-n-octoxybenzophenone | 2 g |
| Methyl ethyl ketone to make | g |

The solution was coated with a doctor knife to a wet thickness of 0.006 inches on a 0.01 inch sulfite treated paper board, dried and exposed through a process transparency with the nuArc ® Platemaker for 45 seconds. The imagewise exposed surface was developed as in Example VIII with a water-ink dispersion. Ink adhered to the exposed portions of the coating. The sample was placed on an offset type office copy machine, and used to print 100 offset negative copies of the original transparency on bond paper using a lithographic black ink.

The foregoing examples illustrate that treating the imagewise exposed layer with a solvent leaches the polymerizable ethylenically unsaturated compound from the layer in the unexposed areas, so that the binder remains in those areas substantially without any ethylenically unsaturated compound. The unexposed, leached areas therefore consist essentially of binder. The exposed areas consist essentially of the binder and the polymerized ethylenically unsaturated compound and therefore have a hydrophilicity or oleophilicity different from that of the unexposed, leached areas.

I claim:

1. A printing plate having addition polymerized and unpolymerized image areas which comprises a support bearing over its entire surface a layer comprised of a hydrophilic or oleophilic polymeric binder and in the addition polymerized image areas a polymerized ethylenically unsaturated monomer of hydrophilic or oleophilic character opposite that of the polymeric binder, the unpolymerized image areas being substantially free of said ethylenically unsaturated monomer.

2. A printing plate according to claim 1 wherein the hydrophilic and oleophilic image areas are in substantially the same plane.

3. A positive working printing plate according to claim 1 having oleophilic areas consisting essentially of a polymeric binder substantially free of ethylenically unsaturated compound and hydrophilic areas consisting essentially of said polymeric binder and a polymerized ethylenically unsaturated compound.

4. A negative working printing plate according to claim 1 having hydrophilic areas consisting essentially of a polymeric binder substantially free of ethylenically unsaturated compound and oleophilic areas consisting essentially of said polymeric binder and a polymerized ethylenically unsaturated compound.

5. A printing plate according to claim 3 wherein said polymeric binder is selected from polymethylmethacrylate, vinyl chloride/vinyl acetate/vinylidene chloride terpolymer, and polycaprolactone and said ethylenically unsaturated compound is water soluble in its unpolymerized state and substantially insoluble in water in its polymerized state.

6. A printing plate according to claim 5 wherein said ethylenically unsaturated compound is selected from polyoxyethyltrimethylolpropane triacrylate, tetraethylene glycol dimethacrylate, and triethylene glycol dimethacrylate.

7. A printing plate according to claim 4 wherein said polymeric binder is selected from cellulose acetatebutyrate, cellulose acetate, and hydroxypropyl cellulose and said ethylenically unsaturated compound is selected from trimethylol propane triacrylate, trimethylolpropane triacrylate, trimethylolpropane trimethacrylate, and polypropylene glycol ether of pentaerythritol tetraacrylate.

* * * * *